United States Patent [19]

Goodwin et al.

[11] Patent Number: 4,977,540
[45] Date of Patent: Dec. 11, 1990

[54] SPIN GLASS TYPE ASSOCIATIVE PROCESSOR SYSTEM

[75] Inventors: James M. Goodwin, Los Angeles; Bruce E. Rosen, Marina del Rey; Jacques J. Vidal; John D. Mackenzie, both of Los Angeles; Edward T. H. Wu, Agoura Hills, all of Calif.

[73] Assignee: The Regents of the University of California, Berkeley, Calif.

[21] Appl. No.: 209,976

[22] Filed: Jun. 22, 1988

[51] Int. Cl.$^5$ .................. G11C 7/00; G11C 15/00; G11C 13/06

[52] U.S. Cl. ........................... 365/49; 365/120; 365/121; 365/122; 365/189.09; 307/201; 364/807

[58] Field of Search ............... 365/120, 121, 189.09, 365/122, 171, 49; 360/59; 307/201; 364/807; 428/678, 679, 694, 900, 928

[56] References Cited

U.S. PATENT DOCUMENTS

| | | | |
|---|---|---|---|
| 3,887,906 | 6/1975 | Minnaja | 365/122 X |
| 4,586,161 | 4/1986 | Skoda | 360/59 X |
| 4,615,944 | 10/1986 | Gardner | 360/131 X |
| 4,672,594 | 6/1987 | Kato et al. | 365/121 X |
| 4,694,358 | 9/1987 | Muchnik et al. | 360/135 X |
| 4,799,114 | 1/1989 | Tsunashima | 360/59 |

OTHER PUBLICATIONS

Neurocomputing Foundations of Research by J. A. Anderson and Edward Rosenfeld, the MIT Press, Cambridge, Mass. (1988).

A Learning Algorithm for Boltzmann Machines, by D. H. Ackley, G. Hinton & T. J. Sejnowski, Johns Hopkins University.

Optical Neural Computers, by Y. S. Abu-Mostafa and D. Psaltis, Scientific American, Mar. 1987 issue.

Optical Disks Become Erasable, by Robert P. Freese, Alphatronix, Inc. . . . IEEE Spectrum, Feb. 1988 issue.

*Primary Examiner*—James W. Moffitt
*Assistant Examiner*—Alyssa H. Bowler
*Attorney, Agent, or Firm*—Poms, Smith, Lande & Rose

[57] ABSTRACT

An associative data processor including a spin glass type amorphous magnetic film has input areas, output areas, and "hidden" or associative areas. A coil provides selective magnetic biasing, and lasers provide selective digital input to the input and output areas, which are intercoupled by the associative areas. Following input of a number of digital patterns to the processor, and "learning" by heating the associative areas, an incomplete input pattern may be applied, and the complete pattern read by sensing the polarization of reflected polarized light from the output areas.

19 Claims, 3 Drawing Sheets

TRAINING PHASE: LEARNING I/O PAIRS

PREPARE TO RECALL

RECALL OF LEARNED VECTORS

DATA OUTPUT PHASE

SPIN GLASS TYPE ASSOCIATIVE PROCESSOR SYSTEM

FIELD OF THE INVENTION

This invention relates to associative memories or processors, wherein full information is initially stored in the memory, and this full information may be recalled when partial information is input to the associative memory. Further, in associative processors, stored information may be used to process input information and produce new information.

BACKGROUND OF THE INVENTION

Systems of the type outlined in the previous paragraph have been compared to neural networks in human beings; and there has been considerable work in designing electrical circuits which simulate neural networks. The standard approach to a neural network is to propose a learning rule, usually based on a synaptic analogy, with a "synapse" being the point at which a nervous impulse passes from one neuron to another. An important article discussing such systems was written by J. J. Hopfield, and is entitled "Neural Networks and Physical Systems with Emergent Collective Computational Abilities," Proceedings of the National Academy of Sciences, 79:2554 2558. This article and an accompanying introduction also appear at pages 457 through 464 of "Neurocomputing; Foundations of Research" edited by James A. Anderson and Edward Rosenfeld, MIT Press, Cambridge, Mass, 1988.

One particular neural network circuit implementation model is disclosed in an article entitled "A Learning Algorithm for Boltzmann Machines" by David H. Ackley et al, Cognitive Science, Vol. 9, pp. 147-169, 1985. A Boltzman machine may be considered to be a layered system constructed of units which can be in on or off states, of link weights, connecting "hidden" or associative units with input and output units, and which can take on values from the real numbers. A weight modifies the output of the unit feeding it, and passes the result as an input to the unit which it feeds. In addition to input and output units are "hidden" or "associative" units which assist in processing. It has been proposed heretofore to implement "hidden" or associative units by electrical or electronic circuits. The Boltzmann Machine operates by presenting examples of Input/Output (I/O) patterns to the I/O units, and then allowing the "hidden" or associative units to adjust stochastically to minimize a function referred to as energy. The weights are adjusted so that the hidden or associative units behave in the same way whether the outputs are fixed or left free. The weight adjustment (learning) procedure is local but is computationally expensive and slow, at least in part as a result of the need to implement the "hidden" or associative links by electronic circuits.

Accordingly, a principal object of the present invention is to provide an inexpensive, rapid associative memory and/or processor having a massive information storage capacity.

SUMMARY OF THE INVENTION

In accordance with a preferred embodiment of the present invention, a "spin glass" film or chip is employed in the implementation of a Boltzmann type Machine, with the body of the film or chip between input and output points forming the "hidden" or associative units and links between input and output points, in place of the circuits which have previously been proposed.

With regard to the term "Spin Glass", it is applied to materials such as Gd Tb Fe Co, where the included elements are gadolinium (Gd), terbium (Tb), iron (Fe), and cobalt (Co). The word "spin" refers to the magnetic "spins" of the magnetic material, and the use of the term "glass" implies that the material is amorphous and in some respects similar to glass.

In one typical system, certain areas on the spin glass film would be designated "inputs" and interspersed with and spaced from the inputs would be areas designated "outputs", with the space between the input and output areas serving as "hidden" or associative portions of the film.

The system would include one or more lasers, a coil for applying a magnetic field to the "spin glass" film, and an optical polarization sensitive detector.

In the operation of the processor one typical series of steps would involve the following:

1. Initialize the magnetic state of the film to (a) an un-magnetized or (b) a unidirectionally polarized state.

2. Apply a laser beam to selected input and output areas with the magnetic field on. A pattern of output areas with the magnetic field on. A pattern of binary coded signals may be applied to the input and output areas in various ways. With an un-magnetized or randomly oriented film, a binary "1". could be written in selected input and output areas by applying the laser to these areas with the magnetic field "on"; and a binary "0" could be indicated by no energization. Alternatively, opposite polarization of 1's and 0,s could be accomplished by reversing the magnetic field between writing the two types of binary signals. As a third alternative, with the film polarized in one direction, one or the other of the binary symbols could be entered by reversing the magnetic polarization in the selected input and output areas. In each case, laser heating of the areas frees the material so that the magnetic spins may align with the applied magnetic field.

3. With the magnetic field off, heat is now applied to the associative or "hidden" areas, preferably at a relatively high level to enable both mobility and polarization.

4. New patterns of digital signals are applied, overriding the prior signals applied to input and output areas, or following "erasing" or resetting of the input and output areas to their initial states. The new entries are made with the magnetic field on.

5. Step 3 is repeated.

6. Steps 4 and 5 may be repeated so that the memory may have a number of entries.

7. With the magnetic field on, laser signals corresponding to one of the "learned patterns" are applied to each of the input areas, but not the output areas, to polarize these input areas, to prepare for the recall step.

8. With the magnetic field off, the associative and the output areas are heated, to "induce" the original signals into the "output" zones.

9. The output zones are read, with the magnetic field off; and the system will have "remembered" the outputs associated with particular inputs so that the correct outputs will be retrieved.

Further, the "input" and "output" zones can be considered to be a single larger set of digital signals, and Step 7 set forth above could include only a portion, such as one-half or more, of any of the known digits of the information to be recalled, and the remaining digits forming the complete original digital input could then be recalled by Steps 8 and 9. This technique could be useful when a noisy signal is involved, and certain digits or pulses have been distorted so that it is not clear whether the specific digits in question represent binary "1's" or "0's"; and then in the initial recall Step No. 7, as set forth above, these digits would be omitted, and then read later, in Step No. 9.

Concerning materials, a spin glass layer formed of about 75% cobalt and iron, and about 25% terbium and gadolinium is to be preferred. Further, of the iron-cobalt, the preferred combination is 90% cobalt and 10% iron; and regarding the gadolinium and terbium, about 9.5% terbium and 90.5% gadolinium is preferred. However, substantial variations from these very specific preferred percentages may be employed, and good results may still be obtained.

Other materials which could be employed include garnets, such as $Ga_3Fe_5O_{12}$, on a substrate such as a single crystal sapphire. This material has magnetic properties similar to the spin glass material noted hereinabove, and the steps employed in the processor would correspond generally to the nine steps listed above. Ferroelectric materials could also be used, with the induced electric dipoles serving the same function as the magnetic dipoles in the example noted above. Also, an applied electric field would be used for biasing instead of the magnetic field, and the lasers would still be used for heating, to facilitate internal material orientation. Other materials which may be used include liquid crystals and photo-refractive materials. All of these polarizable materials may be referred to herein as "Spin Glass type" materials.

It is contemplated that a spin glass type element could be approximately one millimeter square, and approximately one micron, or one millionth of a meter thick. An array of perhaps 1,000 by 1,000 areas would be provided, for accessing by laser beams, including perhaps 250,000 input areas, 250,000 output areas, and 500,000 "hidden" or associative areas. The areas could be oriented hexagonally, like touching coins, as the laser beams are normally circular; or the areas could be in an orthogonal array, for ease and simplicity in deflecting the laser beams; or other tesselations can be used.

Accordingly, a broad aspect of the invention contemplates the use of a polarizable thin film, means for establishing an array of input and output areas in the film, with associative or "hidden" areas between the input and output areas, arrangements for selectively applying a polarizing field to the film, and laser means for heating selected input and/or output or associative areas for facilitating polarization of the heated areas, and means for detecting the polarization of output areas.

It is further noted that, as to implementation, the heating or annealing of the hidden or associative areas may be accomplished using a mask to block heating of the input/output areas, using a deflecting annealing beam, or by using a ferromagnetic mask applied to the input areas. Also, the processor may be "trained" to perform logic functions such as "AND", "NAND", HALF ADDER, or multiplication algorithums, by entering the binary inputs and correct outputs; and subsequently applying the inputs and reading the logical outputs.

Reference is also made to an article entitled "A Design for a Spin Glass Processor", by James M. Goodwin, Bruce E. Rosen and Jacques J. Vidal, published about July 1987, a copy of which is supplied with the filing of this patent specification, and which is hereby incorporated by reference into the present specification.

Incidentally, with regard to the application of laser beams to the spin glass type material, the polarization and mobility may be enabled by other sources of energy such as electron beams or a microwave field, for specific examples. Other particle beams could be employed. Normally, the energy required to induce mobility is somewhat greater than that required to enable polarization. The terms "polarization enabling energy" and "mobility enabling energy" will be employed to include all of these various energy sources. It is also noted that mobility enabling, with accompanying somewhat higher energy levels is important in the learning step.

Other objects, features, and advantages will become apparent from a consideration of the following detailed description, and from the accompanying drawings.

DETAILED DESCRIPTION

Figure 1:
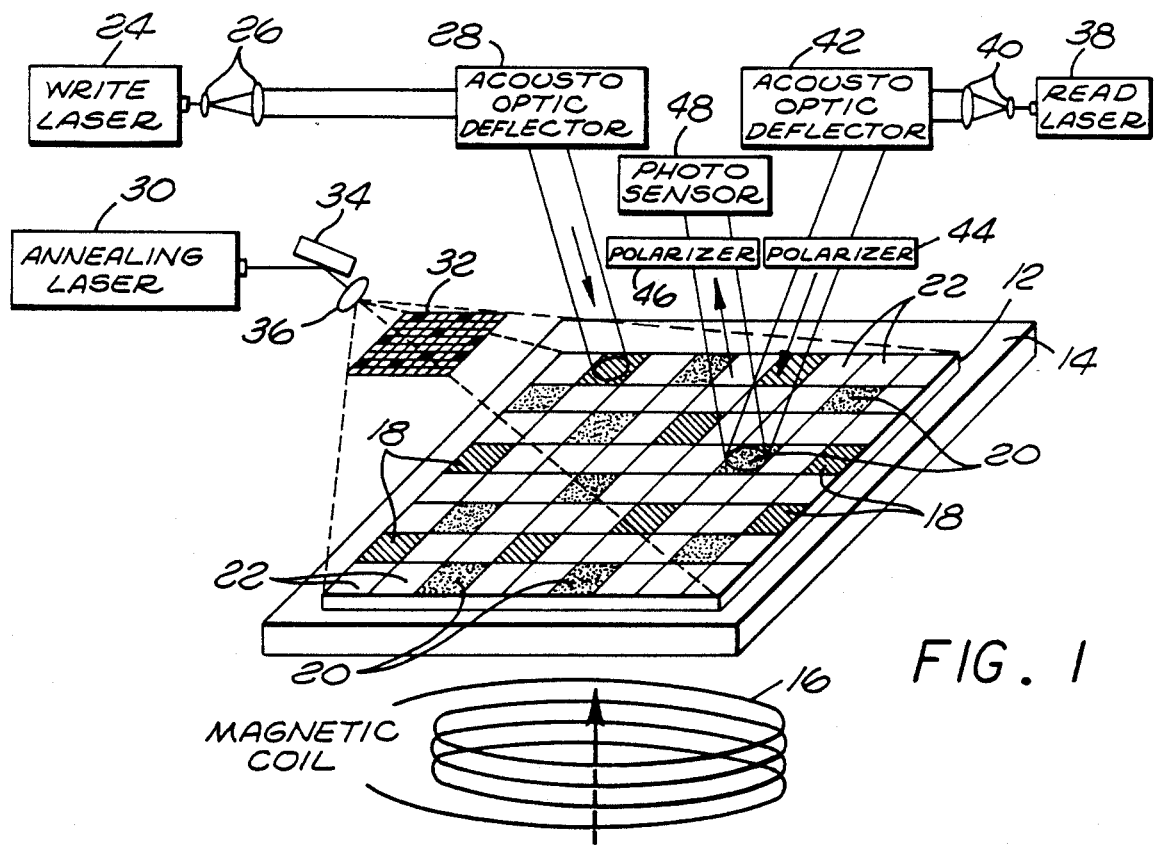
FIG. 1 is a diagrammatic showing of one embodiment of the invention using an annealing mask.

Referring more particularly to the drawings, FIG. 1 is a schematic showing of an associative processor illustrating the principles of the present invention. More specifically, in FIG. 1, a spin glass type film 12 is mounted on a substrate 14 which may be formed of glass or other material. Below the film or layer 12 and the substrate 14 is a magnetic coil 16 which may selectively apply a biasing magnetic field perpendicular to the surface of the film.

Shown above the spin glass film 12 are a number of components for coupling to selected discrete areas on the spin glass film 12. More specifically, the spin glass film 12 has a number of input areas 18 which have a cross-section pattern therein, and a number of output areas 20 which are designated by dots or speckling. Between the input areas 18 and the output areas 20 are a number of additional areas 22, designated "hidden" or "associative" areas which serve to couple the input and output areas in a manner to be discussed in greater detail hereinbelow. The write laser 24 is coupled through a lens system 26 to an acousto-optic deflector 28 which directs the laser beam to the input areas 18 and to the output areas 20 to heat these areas and to facilitate their polarization when the magnetic coil 16 is applying a polarizing magnetic field to the spin glass film.

Radiation from an annealing laser 30 is directed through the annealing mask 32 by an optical system including a mirror 34 and a lens 36. The annealing mask 32 permits the application of heat to the "hidden" or "associative" areas 22 as one step in the associative process. Opaque areas in the annealing mask 32 permit the application of lower level heat directly to the associative areas without impinging on the input areas.

In order to read the output areas 20, a low intensity read laser 38 is coupled through the lens system 40 to the acousto-optic deflector 42 and, through the polarizer 44, so that a beam of polarized laser light impinges on a selected one of the output areas 20. A reflected beam is directed through the polarizer 46 and the resultant illumination is sensed by the photosensor 48. As is known in the art, the polarization of the beam is affected by the magnetization of the spin glass film. Incidentally, it is known to use spin glass materials in erasable magneto-optic storage systems and one such system is described in a March 1986 issue of *Electronic Products*. However, such systems as have been employed heretofore, have merely been concerned with storing digital data, and retrieving exactly the same digital data which was stored, and did not suggest the use of such technology in the associative memory, or neural network field.

Consideration will now be given to a cycle of operation of the associative processor.

1. Step No. 1 — As an initial step, it is desirable that the magnetization of the spin glass film be normalized, biased in one direction, biased in the opposite direction, or essentially neutralized, so that the discrete areas on the film have no significant magnetic moment in one direction or the other.

2. Step No. 2 — The coil 16 energized, and the desired digital pattern is entered into the input and output areas by the application of signals from the write laser 24 to the input and the output areas. The pattern which is entered would be a series of binary signals, and different polarization would be applied to the various areas to indicate either a "1" or a "0". This could be accomplished by selectively directing the laser beam only to those areas which are to be polarized, with the magnetic coil providing a biasing magnetic field in a single direction. Alternatively, the binary "1's" could be represented by a polarization in one direction, then the binary "0's" could be entered by reversing the polarity of the magnetic coil 16 and then deflecting the write laser to the remaining discrete input and output areas.

Figure 2:
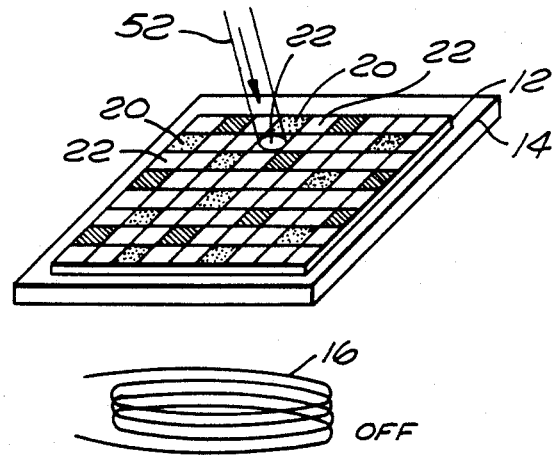
FIG. 2 shows the learning step in which associative areas are subject to heating or annealing, following the entry of input/output patterns of digital information into the processor.

Step No. 3 — The training or learning phase is shown in FIG. 2 of the drawings. With the magnetic field off, the associative areas 22 are heated, either using the annealing laser as shown in FIG. 1, or by deflecting an annealing laser to the associative areas 22, as indicated by the laser beam 52, as shown in FIG. 2. Of course, the input and output areas are in their polarized state during the learning or training step as shown in FIG. 2.

Step No. 4 — New inputs are then applied to the input and output areas, and the training or learning phase of Step No. 3 is repeated, and this cycle may occur a number of times.

Figure 3:
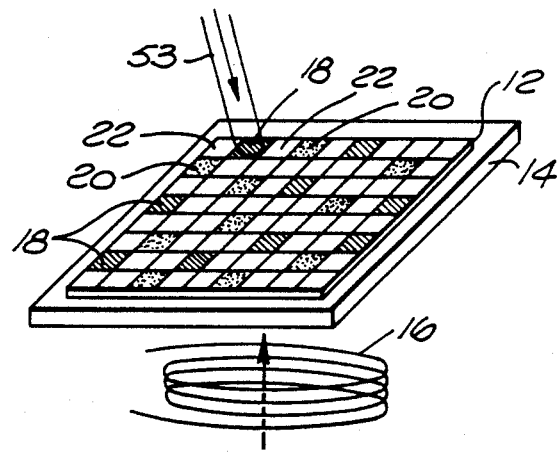
FIG. 3 diagrammatically indicates the step of re-writing data to input areas preparatory to recalling missing data.

Step No. 5 — Now, when it is desired to use the associative processor for recall, input signals are applied to the input areas only, and not to the output areas. In this regard, it may be noted that an incomplete or noisy digital pattern may be applied to selected areas, with these selected areas being designed "input" areas, and the remaining areas to which the complete patterns were originally applied are known as "output" areas. During the entry of this partial digital pattern, the magnetic field of coil 16 is being applied to the spin glass layer or film 12. This step of rewriting the input areas 18, is shown in FIG. 3 of the drawings, wherein the laser beam 53 is impinging on one of the input areas 18.

Figure 4:
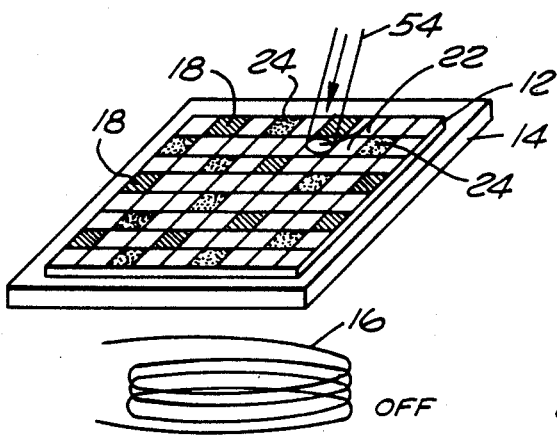
FIG. 4 shows diagrammatically the step of recalling learned information, by applying low heat to the associative and output areas.

Step No. 6 — Referring now to FIG. 4 of the drawings, this involves the recall of learned vectors. In this step, a low intensity laser or other heat source heats the hidden or associative areas, as well as the output areas, while the input areas 18 remain fully polarized with the partial signals of the digital pattern to be recovered. The low intensity laser beam is indicated by the reference numeral 54 and is shown impinging on one of the associative areas 22. In practice, an incomplete digital pattern which has previously been applied to the processor is employed, and the known digits of the incompletely recalled digital pattern are applied to the appropriate areas of the processor, and the step of FIG. 4 induces into the output areas 24, the remainder of the incomplete pattern.

Figure 5:
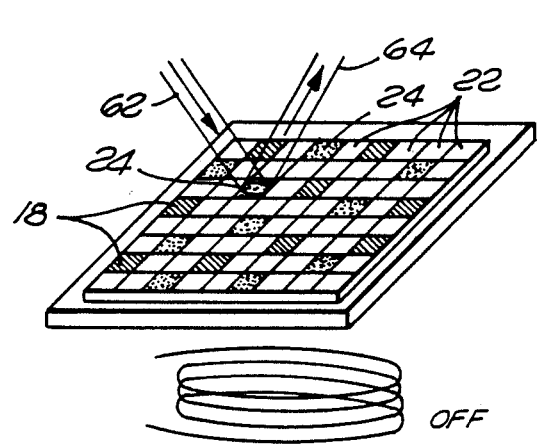
FIG. 5 shows the data output phase or step, in the use of the present invention.

Step No. 7 — As indicated in FIG. 5 of the drawings, the data output phase involves applying a polarized low intensity laser beam 62 to the output areas 24, and sensing the polarization of the reflected beam 64, to determine the polarization of the output areas 24. Of course, during the steps indicated by FIGS. 4 and 5, the magnetic coil is de-energized. This technology for sensing the magnetic polarization of record areas is known from the optical digital storage field, as mentioned above.

Figure 6:
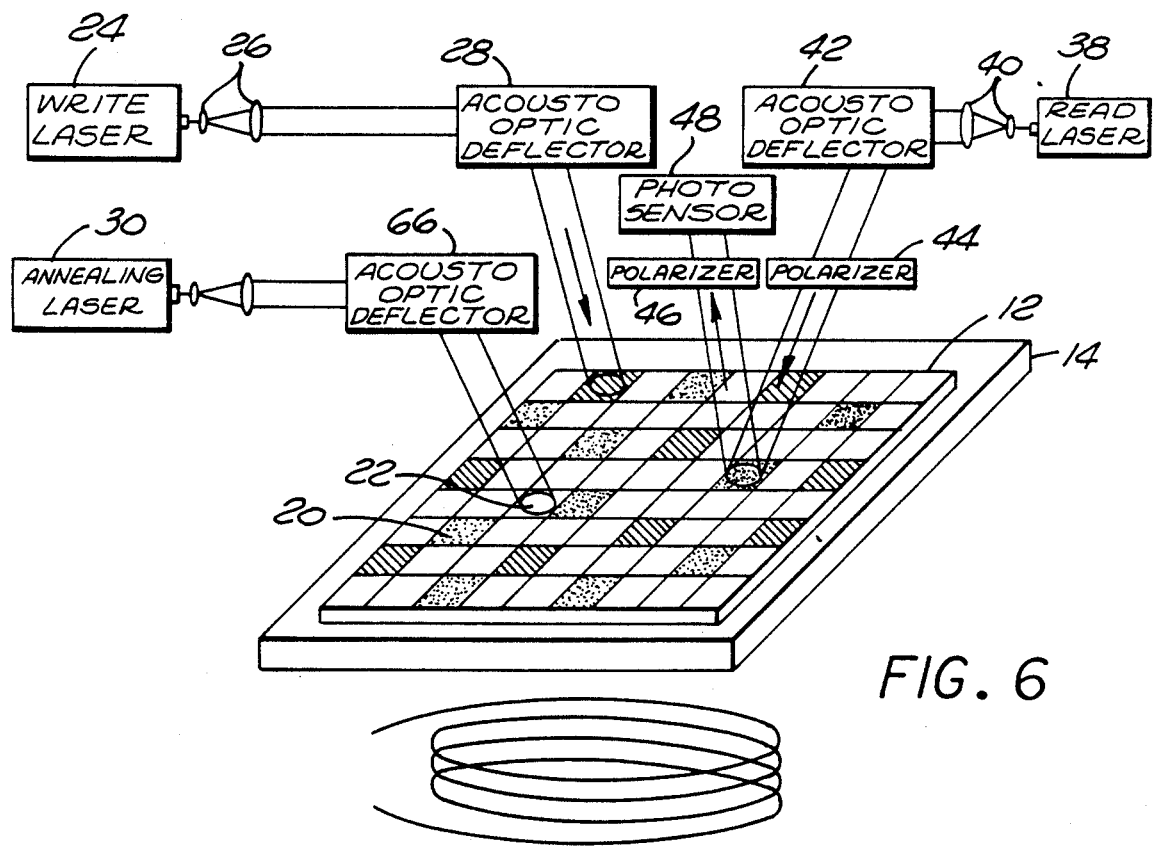
FIG. 6 is a diagrammatic showing of an alternative embodiment of the present invention, wherein the associative or hidden elements are annealed by a deflecting input laser or other heat source.

Turning now to FIG. 6 of the drawings, this is a schematic diagram of an embodiment of the invention which is an alternative to that shown in FIG. 1. More specifically, instead of using an annealing mask, the annealing laser 30 is directed by the acousto-optic deflector 66 to the associative areas 22, and during the preparation for recalling data, to the output areas 20. Thus, in place of the annealing mask, a deflecting system is employed in the embodiment of FIG. 6.

Figure 7:
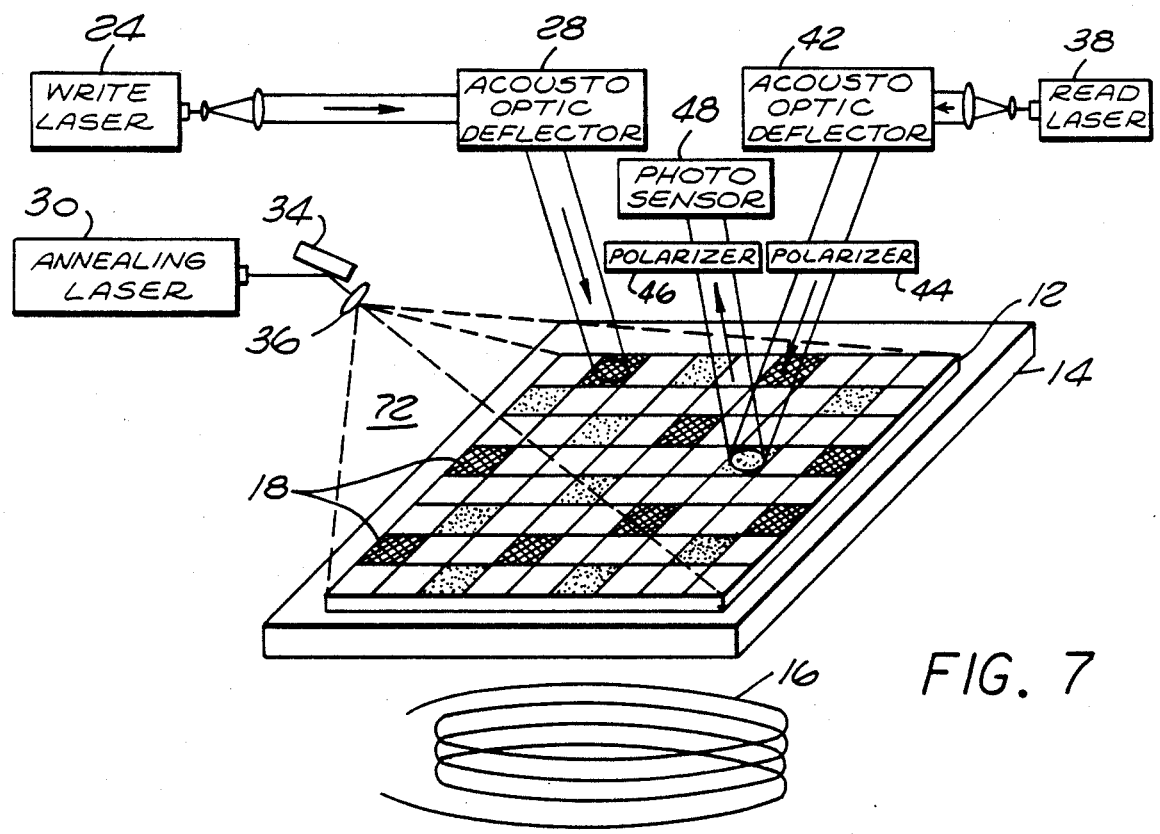
FIG. 7 shows still another embodiment of the invention wherein the input areas are coated with a ferromagnetic photodeposition, to provide an annealing mask function during the annealing step or steps.

In the arrangements shown in FIG. 7, a ferromagnetic deposition is employed over the input areas 18, and this essentially forms a local annealing mask, right on the surface of the film 12. Accordingly, the beam 72 from the annealing laser 30 is applied directly to the entire area of the film 12 instead of initially impinging on the annealing mask 32, as shown in FIG. 1.

Figure 8:
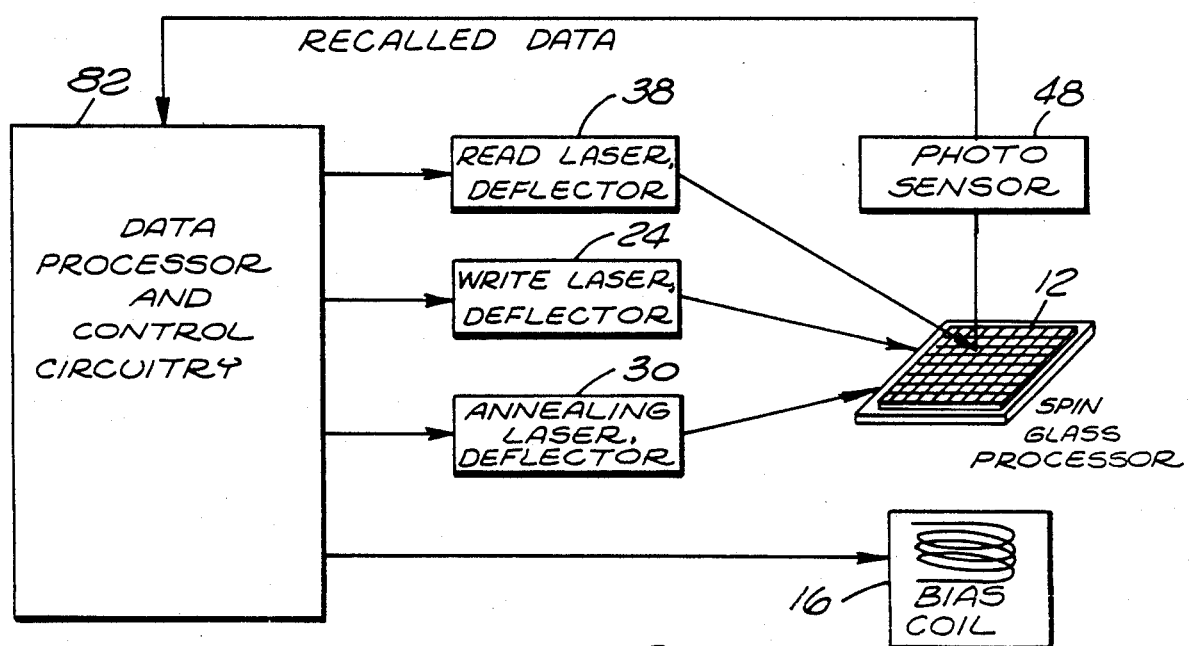
FIG. 8 is a block circuit diagram of an overall system for controlling the processor of FIGS. 1, 6 and 7, and for receiving the recalled data.

FIG. 8 is a diagrammatic showing of the complete system for operating and controlling the apparatus shown in FIGS. 1, 6 and 7. More particularly, with reference to FIG. 8, reference number 82 refers to the data processor and control circuitry employed for operating the apparatus of FIGS. 1, 6 and 7 through the steps set forth hereinabove, including deflecting the various lasers where necessary, and entering and sensing the data applied to the spin glass layer 12. In addition, of course, the bias coil 16 is turned on and off as needed.

For completeness, reference is now made to additional prior articles relating either to neural networks or processors, or to related optical memory technology, as follows:

Optical Neural Computers by Yaser S. AbuMostafa, et al.; *Scientific American,* Mar. 1987, Vol. 256, No. 3, pages 88 through 95.

2. A Learning Algorithm for Boltzmann Machines, by David H. Ackley, et al., *Cognitive Science*, Vol. 9, pages 147 to 169, 1985.

3. Optical Disks Become Erasable, by Robert P. Freese, *IEEE Spectrum*, Feb. 1988, pages 41 through 45.

In conclusion, it is to be understood that the foregoing detailed description and the associated drawings are illustrative of the presently preferred embodiments of the present invention. Various changes way of example, and not of limitation, a plurality of spin glass chips may be employed, rather than just one; alternative deflection and sensing arrangements may be employed; and particularly for the diffuse heating step, another source of heating may be used instead of the annealing laser. Also, as noted above, other sources of energy for inducing polarization and/or mobility in the spin glass type material may be used. Further, instead of merely recalling an incomplete pattern, the processor may perform feature detection, categorization, generalization, or pattern recognition or completion. Accordingly, the present invention is not limited precisely to the embodiments shown in the drawings and as described in detail hereinabove.

What is claimed is:

1. An associative data processing system comprising:
   (a) a body of a polarizable material, the polarization of zones of said body being facilitated or enabled by the application of mobility enabling energy in the presence of a polarizing field;
   (b) said body of material including a plurality of input zones, a plurality of output zones, and means including a plurality of associative zones located between said input and output zones for coupling polarization between said input and output zones;
   (c) means for selectively applying a polarizing field to said polarizable material;
   (d) means for applying polarization enabling energy in a first selected pattern to said input and said output zones in the presence of the polarizing field, to polarize the input and output areas to register a first digital pattern therein;
   (e) means for applying a substantially uniform mobility enabling energy to the associative zones while the input and output zones are polarized and in the absence of the polarizing field, so that the associative zones are at lease partially polarized and to modify interactions in the associative zones;
   (f) means for applying additional patterns to said system as set forth in paragraphs (d) and (e) hereinabove;
   (g) means for applying an output control pattern only to selected input zones of said layer;
   (h) means for applying polarization enabling energy to said associative zones and said output zones to control the binary polarization state of said output zones; and
   (i) means for withdrawings output signals from said output zones in response to said output control input pattern applied to said input zones as specified in paragraph (g), with said output zones assuming a polarization state which is a function of said patterns applied to the input and output zones pursuant to steps (d) through (f), the polarization of said associative areas, and step (h) as set forth above;
   whereby the output based on paragraphs (g), (h) and (i) is a result of the previous series of inputs to the system which constitute a learning function, and this output need not and often will not be a direct binary function of the current inputs to the system.

2. A system as defined in claim 1 wherein said body of polarizable material is formed of a layer of a spin glass material.

3. A system as defined in claim 1 wherein said body of polarizable material is formed of an amorphous magnetic material.

4. A system as defined in claim 1 wherein said body of polarizable material is formed of a magnetizable garnet material.

5. A system as defined in claim 1 wherein said material includes gadolinium, terbium, cobalt and iron.

6. A system as defined in claim 1 wherein said element designated (h) further includes means for applying mobility enabling energy to said output areas.

7. A system as defined in claim 1 wherein said means for applying mobility enabling energy is a laser beam.

8. A system as defined in claim 1 wherein masking means are provided for minimizing the application of energy to said input zones when said associative zones are being energized.

9. A system as defined in claim 1 wherein said means for applying energy to said associative zones includes a laser and deflection means for the resultant laser beam.

10. A system as defined in claim 1 wherein said means for producing a polarizing field includes at least one magnetic coil.

11. A method of operating an associative data processing system including a body of polarizable material which is sensitive to mobility enabling energy, in the presence of a polarizing field, to polarize selected zones of said body; said method comprising the steps of:
    (a) applying one of a plurality of digital signal patterns to said body at selected input and output zones thereof, by directing polarization enabling energy at selected zones in the presence of a polarizing field, said input and output zones having associative zones located between them for coupling polarization between said input and output zones;
    (b) applying mobility enabling energy to said associative zones in the absence of a polarizing field, to induce polarization into said associative zones;
    (c) repeating steps (a) and (b) using different patterns of digital signals applied to at least some of the same input and output zones as specified in step (a), said patterns constituting learned original patterns;
    (d) applying an output control pattern only to selected input zones;
    (e) applying polarization enabling energy to said associative zones and output zones; and
    (f) reading out the polarization state at said output zones, with the said output states at said output zones being a function of said output control pattern, of said learned original patterns, and, also of the inputs from the associative zones;
    whereby the output based on steps (d), (e) and (f) is a result of the previous series of inputs to the system which constitute a learning function, and this output need not and often will not be a direct binary function of the current inputs to the system.

12. A method as defined in claim 11 wherein the polarizing field is a magnetic field.

13. A method as defined in claim 11 wherein step (d) also includes the polarization enabling energy at said output zones.

14. A method as defined in claim 11 wherein the application of energy to said body is accomplished by lasers.

15. An associative data processing system comprising:
   (a) a layer of spin glass material, the magnetization of areas of said layer being facilitated or enabled by the application of heat in the presence of a polarizing magnetic field;
   (b) said layer including a plurality of input zones, a plurality of output zones, and means including a plurality of associative zones located between said input and output zones for coupling polarization from said input zones to said output zones;
   (c) means for selectively applying a magnetic field to said spin glass layer;
   (d) means for applying a laser beam in a first selected pattern to said input and said output zones in the presence of the magnetic field to polarize the input and output zones to register a digital pattern therein;
   (e) means for heating the associative areas while the input and output zones are polarized and in the absence of the polarizing field, so that the spin interactions are modified and the associative zones are at least partially polarized;
   (f) means for applying additional input and output patterns to said system as set forth in paragraphs (d) and (e) hereinabove;
   (g) means for applying a part of a pattern previously applied to said system, to selected input zones of said layer;
   (h) means for heating said associative zones and said output zones to control the binary polarization state of said output zones; and
   (i) means for withdrawing output signals from said output zones in response to said output control input pattern applied to said input zones as specified i paragraph (g), with said output zones assuming a polarization state which is a function of said patterns applied to the input and output zones pursuant to steps (d) through (f), the polarization of said associative areas, and step (h) as set forth above;
   whereby the output based on paragraphs (g), (h) and (i) is a result of the previous series of inputs to the system which constitute a learning function, and this output need not and often will not be a direct binary function of the current inputs to the system.

16. A system as defined in claim 15 wherein said element designated (h) further includes means for heating said output zones.

17. A system as defined in claim 15 wherein said heating of said associative zones as set forth in Step (e) is accomplished at a substantially higher temperature level than the level to which said input 18. A system as defined in claim 15 wherein said means for heating said associative zones includes a laser and deflection means for the resultant laser beam.

19. An associative data processing system comprising:
   (a) a layer of spin glass material, the magnetization of areas of said layer being facilitated or enabled by the application of heat in the presence of a polarizing magnetic field;
   (b) said layer including a plurality of input zones, a plurality of output zones, and means including a plurality of associative zones located between aid input and output zones for coupling polarization from said input zones to said output zones;
   (c) means for selectively applying a magnetic field to said spin glass layer.
   (d) means for applying a laser beam in a first selected pattern to said input and said output zones in the presence of the magnetic field to polarize the input and output zones to register a digital pattern therein;
   (e) means for heating the associative areas while the input and output zones are polarized and in the absence of the polarizing field, so that the spin interactions are modified and the associative zones are at least partially polarized;
   (f) means for applying additional input and output patterns to said system as set forth in paragraphs (d) and (e) hereinabove;
   (g) means for applying a part of a pattern previously applied to said system, to selected input zones of said layer;
   (h) means for heating said associative zones and said output zones to control the binary polarization state of said output zones;
   (i) means for withdrawing output signals from said output zones in response to said output control input pattern applied to said input zones as specified in paragraph (g), with said output zones assuming a polarization state which is a function of said patterns applied to the input and output zones pursuant to steps (d) through (f), the polarization of said associative areas, and step (h) as set forth above; and
   (j) said system including masking means for minimizing heating of said input zones when said associative zones are being heated;
   whereby the output based on paragraphs (g), (h) and (i) is a result of the previous series of inputs to the system which constitute a learning function, and this output need not and often will not be a direct binary function of the current input to the system.

* * * * *